US008741714B2

(12) United States Patent
Lee

(10) Patent No.: US 8,741,714 B2
(45) Date of Patent: Jun. 3, 2014

(54) SUPPORT LINES TO PREVENT LINE COLLAPSE IN ARRAYS

(71) Applicant: Sandisk 3D, LLC, Milpitas, CA (US)

(72) Inventor: Donovan Lee, Santa Clara, CA (US)

(73) Assignee: Sandisk 3D LLC, Milpitas, CA (US)

( * ) Notice: Subject to any disclaimer, the term of this patent is extended or adjusted under 35 U.S.C. 154(b) by 0 days.

(21) Appl. No.: 13/644,119

(22) Filed: Oct. 3, 2012

(65) Prior Publication Data

US 2014/0091381 A1    Apr. 3, 2014

(51) Int. Cl.
*H01L 21/336* (2006.01)

(52) U.S. Cl.
USPC ........... 438/257; 438/424; 438/524; 438/776; 438/E29.252

(58) Field of Classification Search
USPC ......... 438/128–129, 257, 593, 424, 524, 597, 438/778; 257/314–315
See application file for complete search history.

(56) References Cited

U.S. PATENT DOCUMENTS

| 5,981,992 | A | 11/1999 | Calpine |
| 6,429,042 | B1 | 8/2002 | Guida |
| 7,067,902 | B2 | 6/2006 | Hichri |
| 8,288,293 | B2 * | 10/2012 | Pham et al. .................. 438/775 |
| 2006/0110880 | A1 * | 5/2006 | Yuan .............................. 438/257 |
| 2007/0298568 | A1 * | 12/2007 | Mokhlesi ...................... 438/257 |
| 2009/0189211 | A1 * | 7/2009 | Orimoto et al. ............... 257/319 |

* cited by examiner

*Primary Examiner* — Dung A. Le
(74) *Attorney, Agent, or Firm* — Vierra Magen Marcus LLP

(57) ABSTRACT

Methods for preventing line collapse during the fabrication of NAND flash memory and other microelectronic devices that utilize closely spaced device structures with high aspect ratios are described. In some embodiments, one or more mechanical support structures may be provided to prevent the collapse of closely spaced device structures during fabrication. In one example, during fabrication of a NAND flash memory, one or more mechanical support structures may be set in place prior to performing a high aspect ratio word line etch for forming the NAND strings. The one or more mechanical support structures may comprise one or more fin supports that are arranged in a bit line direction. In another example, the one or more mechanical support structures may be developed during the word line etch for forming the NAND strings.

18 Claims, 14 Drawing Sheets

(Prior Art)

SUPPORT LINES TO PREVENT LINE COLLAPSE IN ARRAYS

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates are referred to as a NAND string. In recent years, NAND flash memory has been scaled (faster than Moore's law) in order to reduce cost per bit. However, as process geometries shrink, many design and process challenges are presented. These challenges include preventing line collapse during the fabrication of NAND flash memory and other microelectronic devices that utilize closely spaced device structures with high aspect ratios (e.g., structures with heights substantially greater than their widths).

DETAILED DESCRIPTION

Technology is described for preventing line collapse during the fabrication of NAND flash memory and other microelectronic devices that utilize closely spaced device structures (including device structures with high aspect ratios). In some embodiments, one or more mechanical support structures may be provided to prevent the collapse of closely spaced device structures during fabrication. In one example, during fabrication of a NAND flash memory, one or more mechanical support structures may be set in place prior to performing a high aspect ratio word line etch for forming the NAND strings. The one or more mechanical support structures may comprise one or more fin supports that are arranged in a bit line direction. In another example, the one or more mechanical support structures may be developed during the word line etch for forming the NAND strings.

Closely spaced device structures (including device structures with high aspect ratios) may be found in various microelectronic devices including semiconductor-based devices (e.g., NAND flash memory), capacitor structures (e.g., structures with closely spaced capacitor plates), inductor structures (e.g., structures with closely spaced inductor coils), flexible electronics, and micro-electro-mechanical systems (MEMS) devices (e.g., resonators and diffraction gratings). One issue with fabricating closely spaced device structures, such as NAND strings in a NAND flash memory, is that the closely spaced structures may be susceptible to collapse during fabrication due to force imbalances caused by various physical phenomena including capillary action, electrostatic forces, and/or the Casimir effect. The closely spaced structures may also be susceptible to collapse due to vibration or mechanical shock (e.g., caused by a sudden movement or acceleration) during fabrication. It should be noted that although trenches or isolation regions separating the closely spaced device structures may be filled with an insulating material in order to provide lateral stability after the trenches or isolation regions have been formed, the insulating material may not be in place during the formation of the trenches or isolation regions themselves (e.g., during etching and/or cleaning of the trenches). Thus, there is a need for preventing line collapse during the fabrication of NAND flash memory and other microelectronic devices that utilize closely spaced device structures with high aspect ratios.

Figure 1:
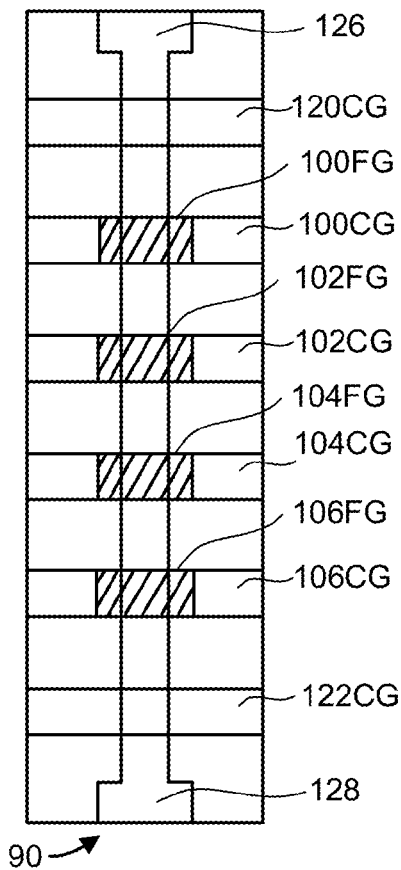
FIG. 1 depicts one embodiment of a NAND string.
Figure 2:
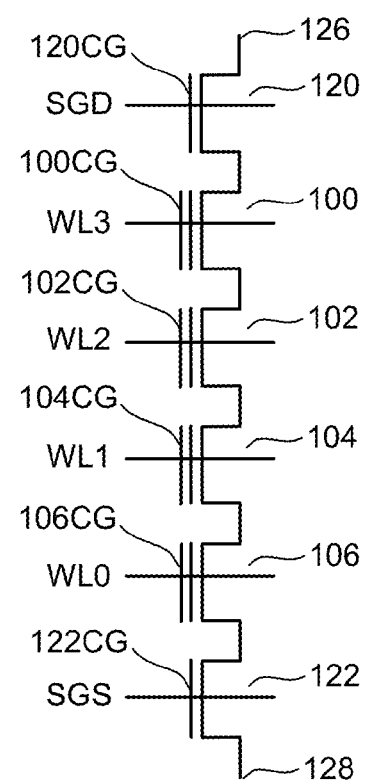
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
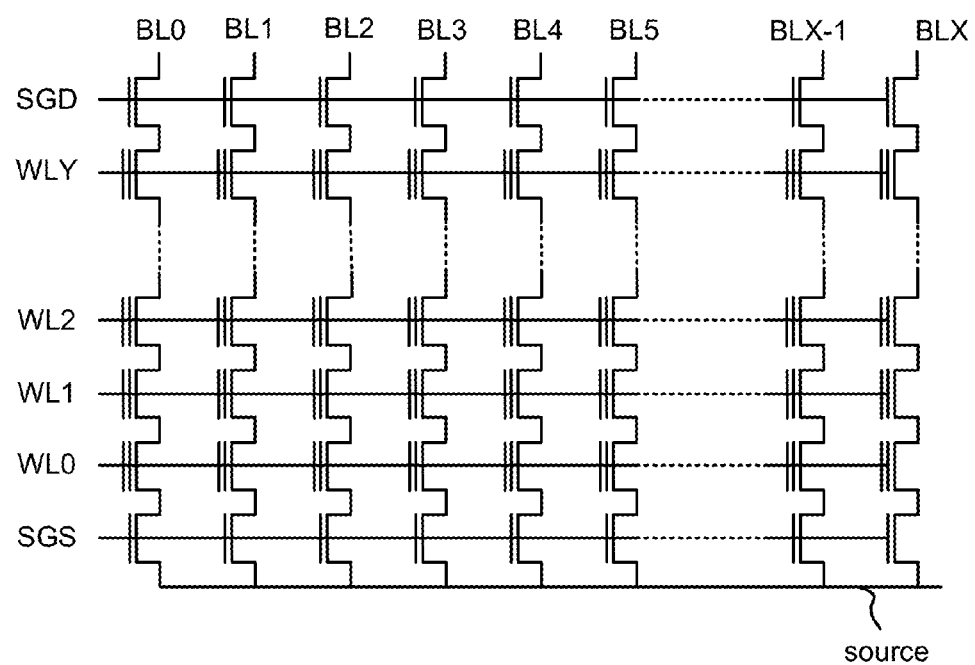
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may be fabricated using the technology described herein.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

One benefit of a shared-bit-line NAND architecture is that it relieves the bit line pitch by 2× since pairing NAND strings with a common bit line allows the total number of bit lines to be cut in half. The increase in bit line pitch for a given process geometry allows for less resistive bit line contacts and the reduced total number of bit lines allows for reduced bit line resistance and/or reduced bit line to bit line capacitance between adjacent bit lines. More information regarding the shared-bit-line memory architecture can be found in U.S. Provisional Application 61/561,286, "Improved Operation for Non-Volatile Storage System With Shared Bit Lines Connected to Single Selection Device" and U.S. Provisional Application 61/422,385, "Non-Volatile Storage System With Shared Bit Lines Connected to Single Selection Device," both of which are herein incorporated by reference in their entirety.

Figure 3B:
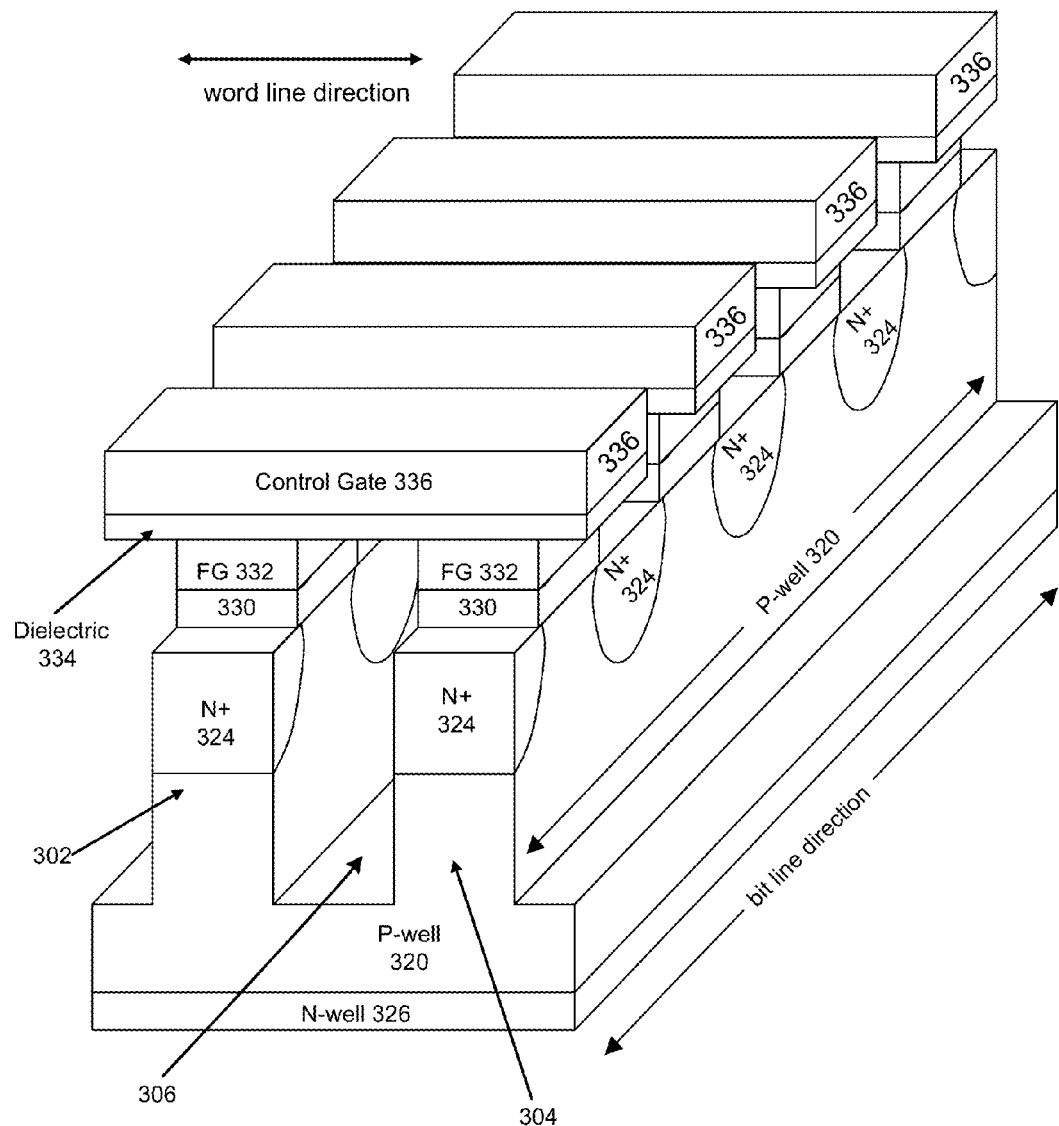
FIG. 3B depicts one embodiment of two NAND strings that may be fabricated as part of a larger flash memory array using the technology described herein.

FIG. 3B depicts one embodiment of two NAND strings 302 and 304 that may be fabricated as part of a larger flash memory array using the technology described herein. As depicted, NAND strings 302 and 304 each include four memory cells, n-type diffusions 324, and a portion of a shared P-well 320. Each memory cell in a NAND string corresponds with a floating gate 332 isolated by dielectric layers 334 and 330. N-well 326 is below P-well 320. The bit line direction (or y-direction) runs in the direction of the NAND strings, and the word line direction (or x-direction) runs perpendicular to the NAND strings or the bit line direction. The word line direction may be referred to as the row direction and the bit line direction may be referred to as the column direction. In some cases, the N-well 326 may sit in a P-type substrate (not depicted). As depicted, NAND string 302 is separated from NAND string 304 by an isolation region 306. The isolation region 306 may include an insulating material or dielectric between adjacent NAND strings (not depicted). Typically, shallow trench isolation (STI) is used to isolate adjacent NAND strings (e.g., using an active area STI). In one embodiment, the control gates 336 correspond with word lines, such as word lines WL0-WLY of FIG. 3A.

Figure 4A:
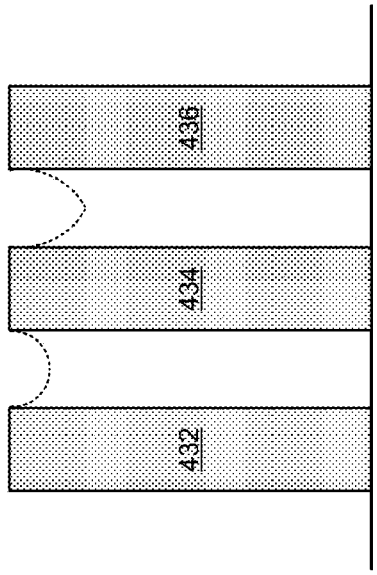
FIG. 4A depicts one embodiment of a portion of a microelectronic device using a cross-sectional view.

FIG. 4A depicts one embodiment of a portion of a microelectronic device using a cross-sectional view. The microelectronic device includes closely spaced device structures 432, 434, and 436. In some embodiments, each of the closely spaced device structures may correspond with a NAND string. Each of the closely spaced device structures may also comprise a micro-machined layer stack. As depicted, the closely spaced device structures 434 and 436 may collapse and stick together during fabrication due to force imbalances caused by various physical phenomena including capillary action and/or the Casimir effect. The closely spaced device structures may also deflect due to external forces, such as those experienced during device packaging and cleaning including vibrations and/or mechanical shock (e.g., caused by a sudden movement or acceleration). Thus, increasing device structure rigidity may prevent deflection caused by both external forces (e.g., vibrations) and internal forces (e.g., attractive forces between adjacent lines).

Figure 4B:
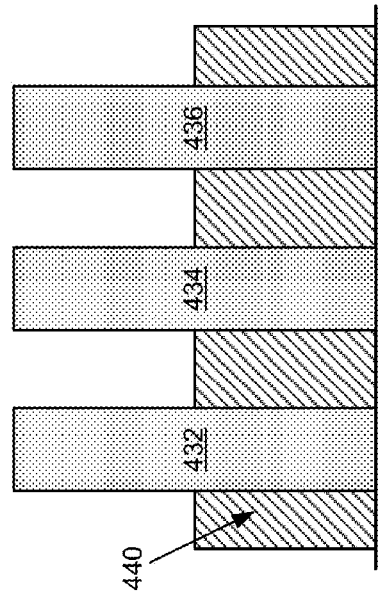
FIG. 4B depicts one embodiment of the closely spaced device structures of FIG. 4A using a cross-sectional view.

FIG. 4B depicts one embodiment of the closely spaced device structures of FIG. 4A using a cross-sectional view, wherein a wet clean process has been performed after etching the trenches between the closely spaced device structures (e.g., to remove residual surface ions). As depicted, due to capillary action, menisci associated with the liquid (e.g., water) near the top of the trenches may vary in size (e.g., due to contaminants located within the trenches) and therefore exert varying degrees of pressure on the upper portions of the closely spaced device structures. More information regarding the effects of capillary action on closely spaced device structures may be found in Namatsu et al., "Dimensional limitations of silicon nanolines resulting from pattern distortion due to surface tension of rinse water," Applied Physics Letters, Vol. 6, No. 20, May 1995, pp. 2655-2657.

Figure 4C:
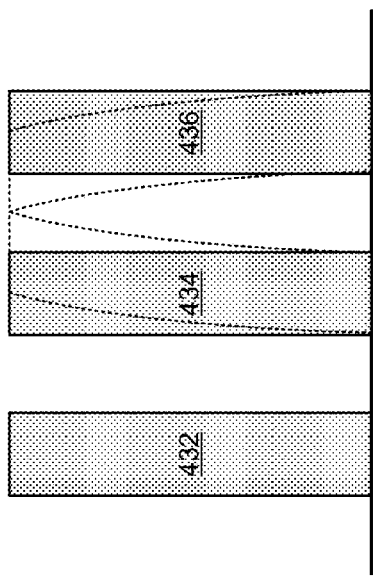
FIG. 4C depicts one embodiment of the closely spaced device structures of FIG. 4A using a cross-sectional view, wherein the spacing between the closely spaced device structures is not perfectly uniform.

FIG. 4C depicts one embodiment of the closely spaced device structures of FIG. 4A using a cross-sectional view, wherein the spacing between the closely spaced device structures is not perfectly uniform. As depicted, the device structure 434 is closer to device structure 432 than it is to device structure 436. In this case, attractive forces (e.g., due to electrostatic attraction, Van der Waals forces, and/or Casimir forces) may cause device structure 434 to deflect towards device structure 432. The degree of deflection may correspond with the aspect ratios of the closely spaced device structures. The attractive forces between closely spaced device structures may increase as the spacing between the closely spaced device structures is reduced. The attractive forces may be a function of the process technology used (e.g., wet processes vs. dry processes) to form the closely spaced device structures.

Figure 4D:
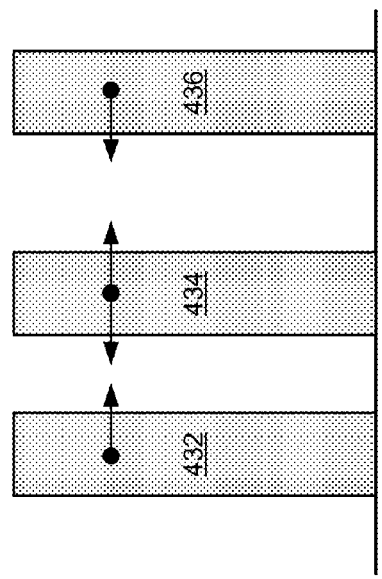
FIG. 4D depicts one embodiment of the closely spaced device structures of FIG. 4A using a cross-sectional view, wherein a mechanical support structure has been used to provide increased rigidity to the closely spaced device structures.

FIG. 4D depicts one embodiment of the closely spaced device structures of FIG. 4A using a cross-sectional view, wherein a mechanical support structure 440 has been used to provide increased rigidity and/or lateral stability to the closely spaced device structures. In one embodiment, the closely spaced device structures 432, 434, and 436 may correspond with memory structures in a memory array (e.g., a NAND memory array). The mechanical support structure 440 may be used to provide support during etching and/or cleaning of the trenches between the closely spaced device structures.

Figure 4E:
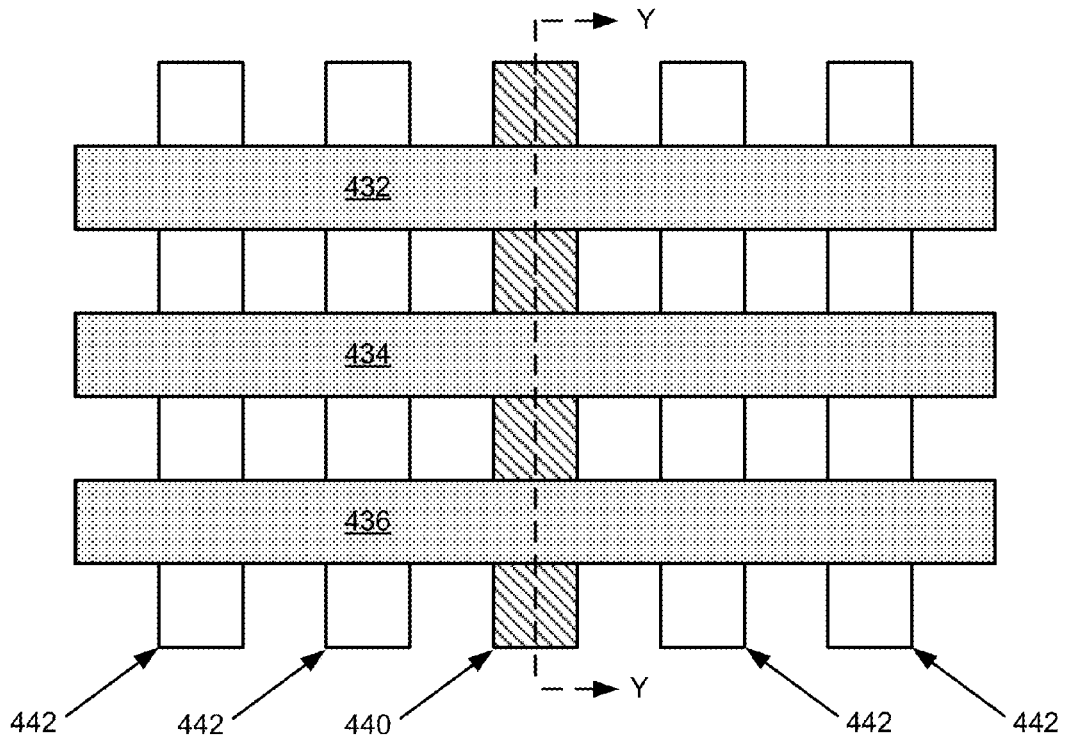
FIG. 4E depicts one embodiment of a memory array including bit lines and closely spaced device structures.

FIG. 4E depicts one embodiment of a memory array including bit lines 442 and closely spaced device structures 432, 434, and 436, wherein a mechanical support structure 440 has been arranged in a bit line direction orthogonal to the direction of the closely spaced device structures 432, 434, and 436. As depicted, FIG. 4D is one example of a cross-sectional view taken along line Y-Y of FIG. 4E. In one embodiment, one or more mechanical support structures may be uniformly placed throughout a memory array in order to increase the mechanical stability and/or rigidity of closely spaced device structures within the memory array. Mechanical support structures may also be placed in the middle of a memory array or near the edges of a memory array.

Figure 5:
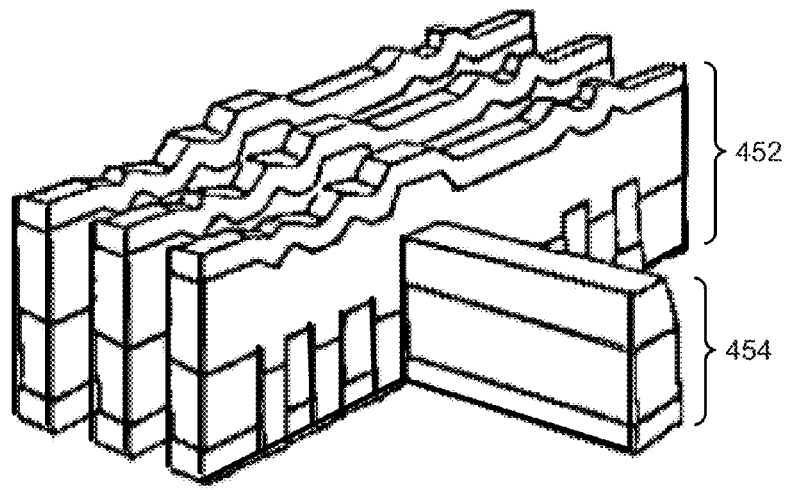
FIG. 5 depicts one embodiment of a portion of a NAND flash memory array.

FIG. 5 depicts one embodiment of a portion of a NAND flash memory array. As depicted, a mechanical support structure 454 arranged in a bit line direction provides torsional and/or lateral support for one or more device structures 452 during and after a word line etch. In some cases, the word line etch may comprise the highest etch leading to the formation of high aspect ratio device structures or features. The trade-off for increased mechanical support may be reduced array efficiency as the one or more bit line pitches used to provide the one or more mechanical support structures may not be usable as addressable bit lines. In one embodiment, the mechanical support structure 454 may include a support strip that is selective against the word line etch (i.e., the support strip will prevent the material under the support strip from being etched during the word line etch).

Figure 6:
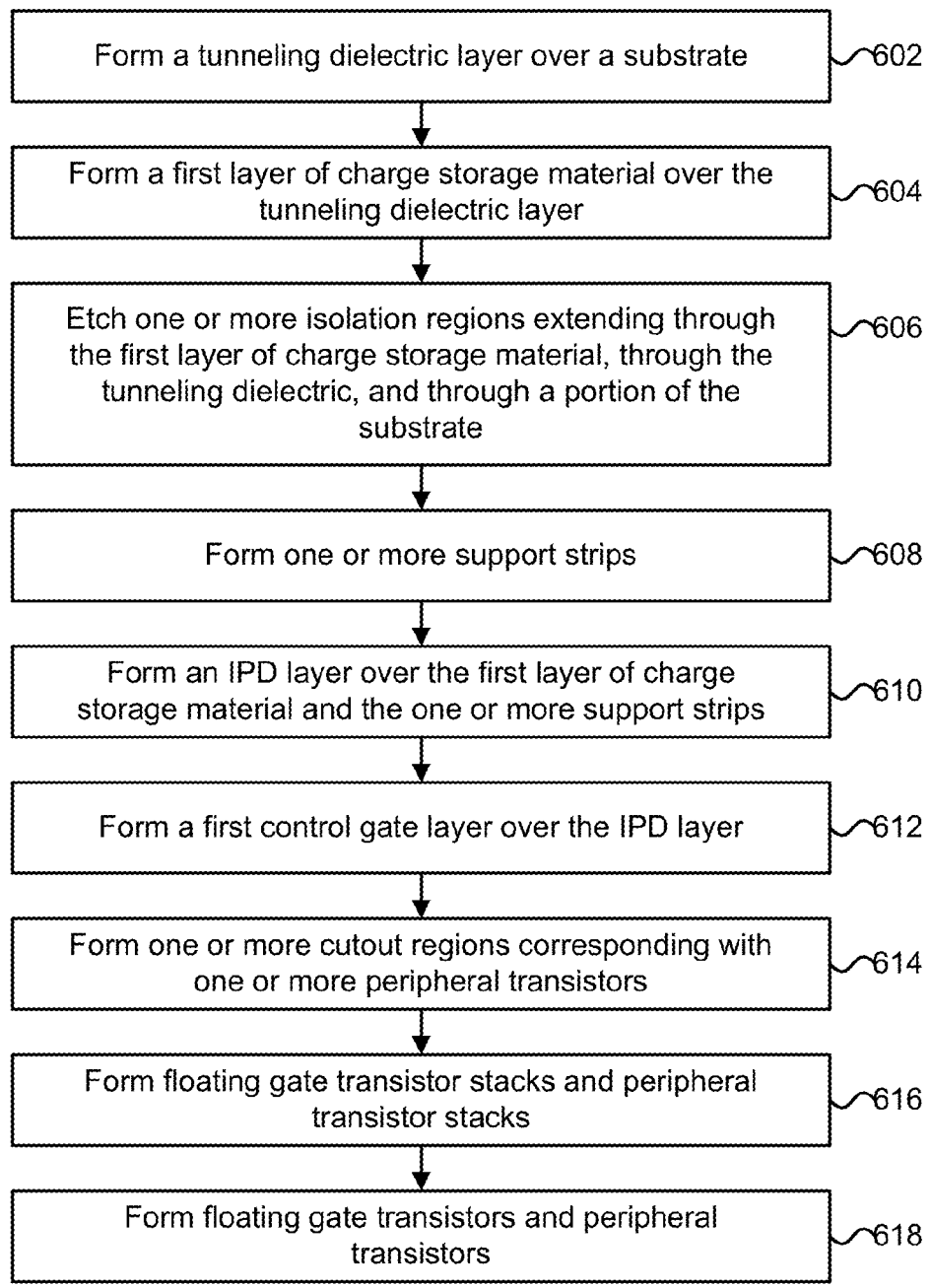
FIG. 6 is a flowchart describing one embodiment of a process for fabricating a non-volatile memory device including one or more support structures.

FIG. 6 is a flowchart describing one embodiment of a process for fabricating a non-volatile memory device including one or more support structures. The flowchart may omit common processing steps (e.g., the formation of isolation regions or structures, various implant and annealing steps, the formation of vias/contacts, the formation of a passivation layer, planarization, etc.) in order to highlight the processing steps described.

FIGS. 7A-7I depict one embodiment of a process for fabricating a portion of a non-volatile memory device including one or more support structures. FIGS. 7A-7I depict various stages of fabrication using cross-sectional views and may be referred to when describing the process of FIG. 6.

Referring to FIG. 6, in step 602, a tunneling dielectric layer is formed on or above a substrate. The tunneling dielectric layer may comprise a thin oxide or a thin nitride oxide. The thin oxide may be formed using a thermal oxidation process. In some embodiments, the thickness of the tunneling dielectric layer may be between 5 nm and 15 nm. In some cases, the tunneling dielectric layer may include one or more layers. In one example, the tunneling dielectric layer may include a multi-layer dielectric film such as an ONO dielectric stack, which includes alternating layers of silicon dioxide ("O") and silicon nitride ("N"). In some embodiments, one or more areas associated with a peripheral circuitry region may undergo additional processing steps in order to form a thicker dielectric for various transistors such as logic gates and/or high-voltage transistors (e.g., a thicker gate oxide between 20 nm and 100 nm).

In step 604, a first layer of charge storage material is formed on or above the tunneling dielectric layer. In one embodiment, the first layer of charge storage material may include a polycrystalline silicon film (or polysilicon). The first layer of charge storage material may be deposited on or above the tunneling dielectric layer in order to eventually form floating gates. The first layer of charge storage material may be deposited using various deposition techniques such as chemical vapor deposition (CVD), physical vapor deposition (PVD), or atomic layer deposition (ALD). In some cases, the thickness of the first layer of charge storage material may be between 50 nm and 150 nm.

In some embodiments, the first layer of charge storage material may be doped in-situ (i.e., may be doped while being grown). The first layer of charge storage material may also be doped after being deposited via diffusion doping or ion implantation. In one embodiment, the first layer of charge storage material may be doped with an n-type dopant (e.g., phosphorus or arsenic). In another embodiment, the first layer of charge storage material may be doped with a p-type dopant (e.g., boron). In one embodiment, the first layer of charge storage material comprises a polysilicon floating gate layer.

Figure 7A:
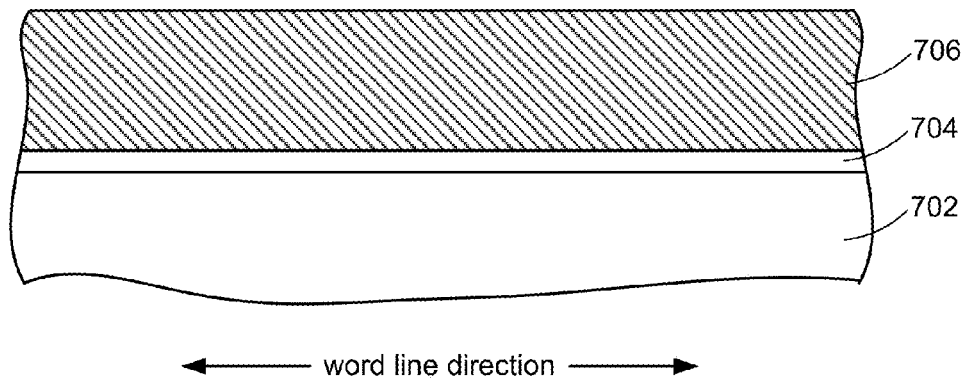
FIGS. 7A-7I depict one embodiment of a process for fabricating a portion of a non-volatile memory device including one or more support structures.

FIG. 7A depicts a cross-sectional view in the word line direction of one embodiment after step 604 has been performed. As depicted, a floating gate layer 706 has been formed on a tunneling dielectric layer 704. The tunneling dielectric layer 704 has been formed on a substrate (or well) 702.

Referring to FIG. 6, in step 606, one or more isolation regions are formed extending through the first layer of charge storage material, through the tunneling dielectric, and through a portion of the substrate. The one or more isolation regions may correspond with openings between column strips (or layer stack columns) in a memory array. In one embodiment, the one or more isolation regions may be formed by etching the first layer of charge storage material to form one or more column strips arranged in a first direction (e.g., a bit line direction). In some embodiments, the one or more isolation regions may correspond with openings between adjacent NAND strings and be filled with an insulating material or dielectric material between the adjacent NAND strings. In one example, the adjacent NAND strings may be isolated using an active area shallow trench isolation (STI). The one or more isolation regions may be formed by patterning and then removing material using various etching techniques such as dry etching, wet chemical etching, plasma etching, or reactive-ion etching (RIE). An anisotropic etch may be used to produce isolation regions with substantially vertical sidewalls. In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist. In one embodiment, multiple patterning lithography techniques (e.g., spacer-based double patterning) may be used to improve feature density.

Figure 7B:
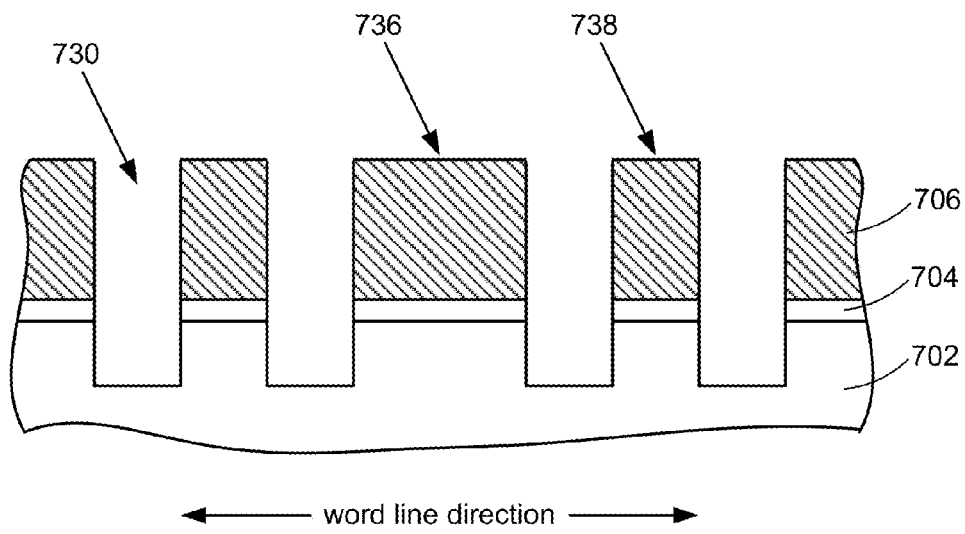

FIG. 7B depicts a cross-sectional view in the word line direction of one embodiment after step 606 has been performed. As depicted, isolation region 730 extends through the floating gate layer 706, through the tunneling dielectric 704, and through a portion of the substrate 702. In some cases, the isolation regions including isolation region 730 may define or correspond with column strips, such as column strip 736 and column strip 738. In some cases, column strip 736 may be associated with a support strip. Although the width of column strip 736 is depicted to be wider than the width of column strip 738, the widths of the column strips may be the same or substantially similar. One benefit of a wider column strip associated with a support strip may be increased lateral support.

Referring to FIG. 6, in step 608, one or more support strips are formed. In one embodiment, the one or more support strips may be formed over and along column strips (or layer stack columns) in a memory array. The one or more support strips may include material that is selective against a word line etch (i.e., the one or more support strips may prevent the material under the one or more support strips from being etched during the word line etch). In some embodiments, the one or more strips may be selective to (or have a high etch selectivity relative to) the first control gate layer and/or the IPD layer. In one example, the one or more support strips may comprise an oxide layer. In another example, the one or more support strips may include nitride or silicon nitride. In one embodiment, the one or more support strips may comprise an etch stop layer. The one or more support strips may be used to form a mechanical support structure underneath the one or more support strips, such as mechanical support structure 454 of FIG. 5. The mechanical support structure may include one or more support layers (e.g., including floating gate layers and/or oxide layers).

In one embodiment, the first control gate layer may comprise a polysilicon layer and the one or more support strips may comprise an oxide layer. In another embodiment, the IPD layer may comprise an oxide layer and the one or more support strips may comprise a nitride layer or a silicon nitride layer.

Figure 7C:
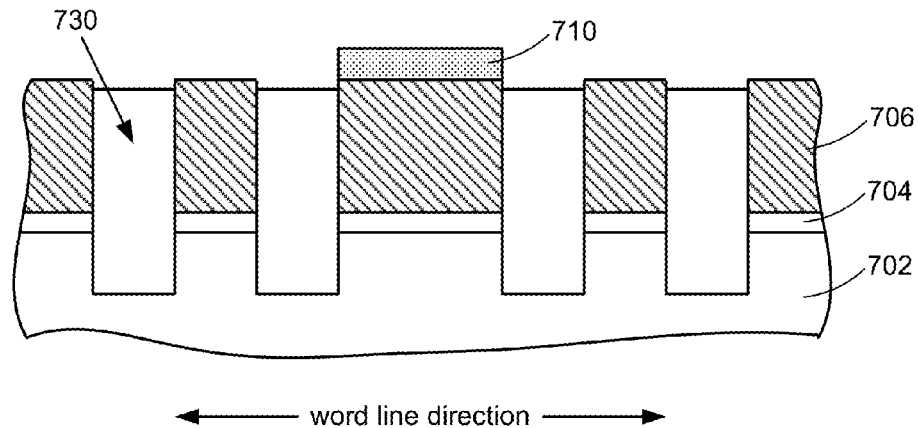

FIG. 7C depicts a cross-sectional view in the word line direction of one embodiment after step 608 has been performed. As depicted, support strip 710 has been formed over one of the column strips associated with the floating gate layer 706 (e.g., over column strip 736 of FIG. 7B). The isolation region 730 may be filled with an insulating material such as silicon dioxide. The support strip 710 may comprise either a conducting material or an insulating material. The support strip 710 may comprise silicon nitride.

Referring to FIG. 6, in step 610, an inter-poly dielectric (IPD) layer is formed. The IPD layer may be formed using a conformal or non-conformal deposition process. In one embodiment, the IPD layer may be formed on or above the first layer of charge storage material and the one or more support strips. In other embodiments, other charge storage layers may be formed between the first layer of charge storage material and the IPD layer. In some cases, the IPD layer may include one or more layers. In one example, the IPD layer may include a multi-layer dielectric film such as an ONO dielectric stack, which includes alternating layers of silicon dioxide ("O") and silicon nitride ("N"). In some cases, an ONO stack may increase the breakdown voltage and/or the charge retention capabilities of a device. The IPD layer may include a high-K (high dielectric constant) dielectric material in order to increase control gate to floating gate coupling in NAND memory arrays.

In step 612, a first control gate layer is formed on or above the IPD layer. In one embodiment, the first control gate layer may include polysilicon. The first control gate layer may be deposited on or above the IPD layer in order to eventually form lower portions of control gates. The first control gate layer may be deposited using various deposition techniques such as chemical vapor deposition (CVD), physical vapor deposition (PVD), or atomic layer deposition (ALD). In some cases, the first control gate layer may be doped in-situ (i.e., may be doped while being grown). The first control gate layer may also be doped after being deposited via diffusion doping or ion implantation. In one embodiment, the first control gate layer may be doped with an n-type dopant (e.g., phosphorus or arsenic). In another embodiment, the first control gate layer may be doped with a p-type dopant (e.g., boron).

Figure 7D:
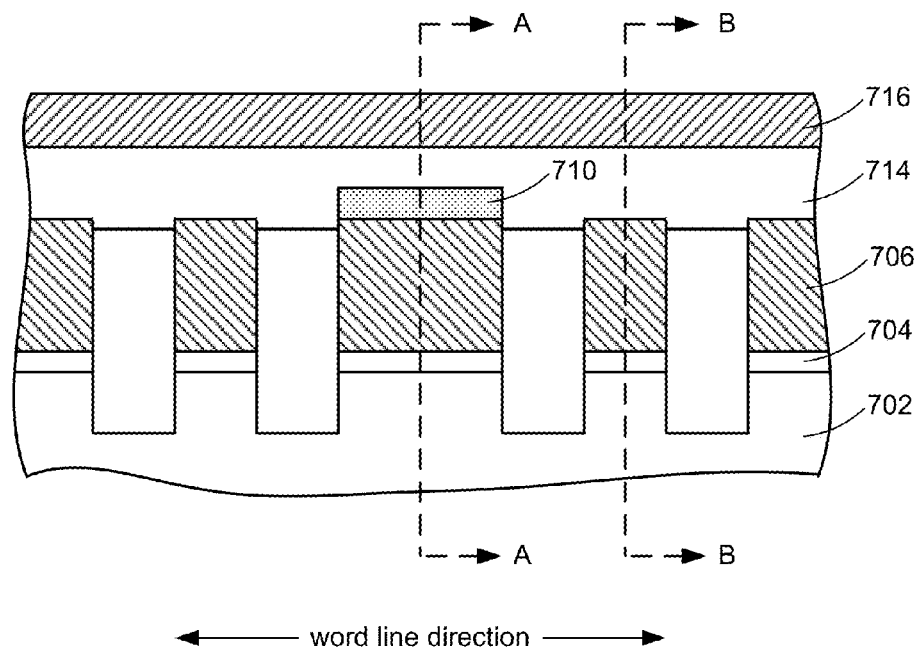

FIG. 7D depicts a cross-sectional view in the word line direction of one embodiment after step 612 has been performed. As depicted, IPD layer 714 has been deposited over the floating gate layer 706 and over the support strip 710. A control gate layer 716 has been deposited over the IPD layer 714.

Figure 7E:
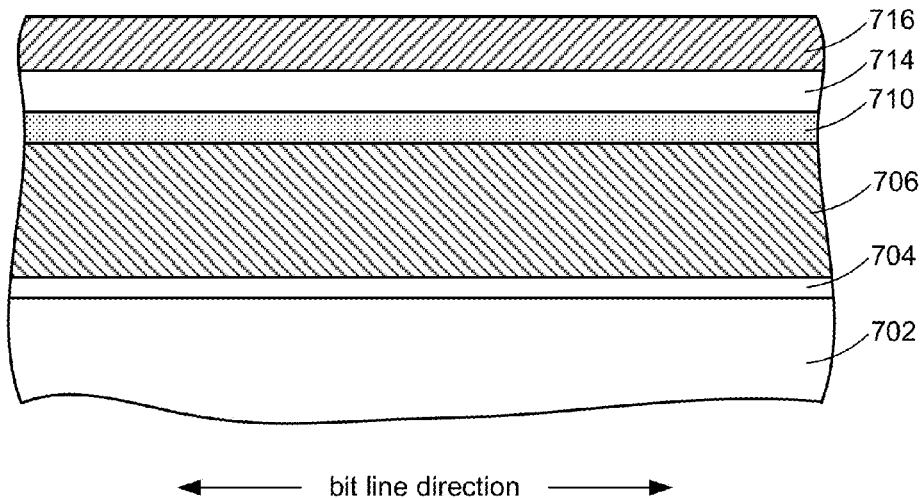
Figure 7F:
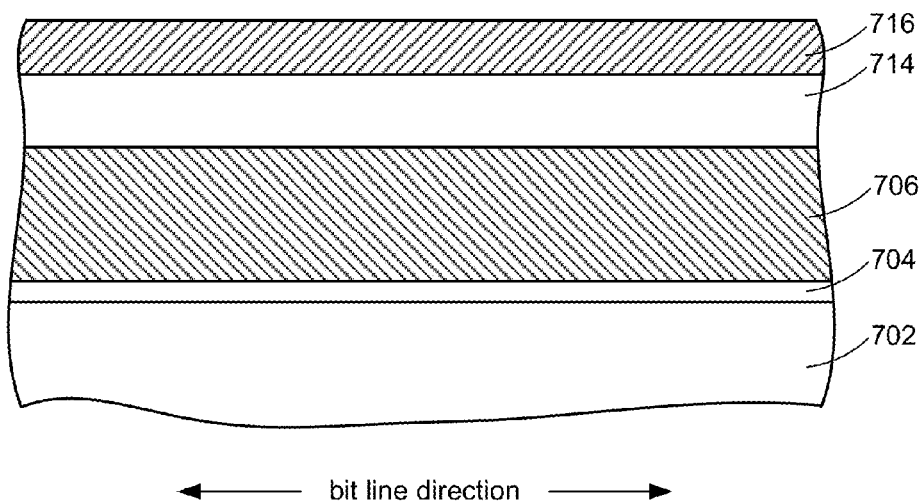

FIG. 7E depicts a cross-sectional view in the bit line direction taken along line A-A of FIG. 7D after step 612 has been performed. FIG. 7F depicts a cross-sectional view in the bit line direction taken along line B-B of FIG. 7D after step 612 has been performed.

Referring to FIG. 6, in step 614, one or more cutout regions corresponding with one or more peripheral transistors are formed extending through the first control gate layer and through the IPD layer. The one or more cutout regions (or openings) may be formed over areas in which the one or more peripheral transistors will eventually be formed. The peripheral transistors (or non-floating-gate transistors) may include select gate transistors (e.g., drain-side select gates and/or source-side select gates) and/or logic transistors. One purpose for the one or more cutouts is to form peripheral transistors that do not have the IPD layer forming a barrier between the first control gate layer and the first layer of charge storage material (i.e., the IPD layer may be removed so that the peripheral transistors do not have a floating gate). In one embodiment, the one or more cutout regions may extend through the first control gate layer, through the IPD layer, and through a portion of the first control gate layer.

The one or more cutout regions may be formed by patterning and then removing material using various etching techniques such as dry etching, wet chemical etching, plasma etching, or reactive-ion etching (RIE). An anisotropic etch may be used to produce cutout regions with substantially vertical sidewalls. In some cases, the selective removal of material may be performed using a lithography sequence including depositing a layer of photoresist (positive or negative) over the material, exposing the layer of photoresist to light via a mask (i.e., the mask determines which areas of the layer of photoresist are exposed to the light), and then selectively etching the material based on the exposed portions of the layer of photoresist.

In some embodiments, a silicide layer or a refractory metal layer may be formed over the first control gate layer or one or more control gate layers. These additional layers may be used to reduce word line resistance. In one example, the refractory metal layer may include tungsten, tungsten silicide, and/or tungsten nitride. The silicide layer and/or refractory metal layer may be deposited using PVD (e.g., via sputtering). In one embodiment, the one or more control gate layers may comprise a poly-metal gate. In one example, the one or more control gate layers may include a lower polysilicon layer and an upper metal layer (e.g., a tungsten layer).

In one embodiment, the first layer of charge storage material may be of a first conductivity type and the first control gate layer may be of a second conductivity type different from the first conductivity type. In one example, the first layer of charge storage material may comprise an n-type material and the first control gate layer may comprise a p-type material. In another example, the first layer of charge storage material may comprise a p-type material and the first control gate layer may comprise an n-type material. A conductivity type may refer to the majority charge carriers within a material. The majority charge carriers within a p-type material are holes and the majority charge carriers within an n-type material are electrons.

Referring to FIG. 6, in step 616, floating gate transistor stacks and peripheral transistor stacks are formed. The floating gate transistor stacks and/or the peripheral transistor stacks may be formed during a word line etch. The word line etch may comprise a high aspect ratio etch and extend through the first control gate layer, through the IPD layer, and through the first layer of charge storage material. In one embodiment, the word line etch may comprise a sequence of etch operations. In one example, the sequence of etch operations may include a first etch of the control gate layer 716, a second etch of the IPD layer 714, and a third etch of the floating gate layer 706. In some cases, a timed etch may be performed in which multiple layers are etched during an etch operation.

In one embodiment, a first masking layer and a second masking layer are formed over the first control gate layer. The second masking layer may be formed over the first masking layer and include tetraethyl orthosilicate (TEOS), silicon dioxide, or silicon nitride. The second masking layer may be used for patterning and then etching isolation regions or trenches between floating gate transistors and/or peripheral transistors, thereby creating the floating gate transistor stacks and the peripheral transistor stacks. The etching of the isolation regions (or trenches) may be performed until the tunneling dielectric layer is reached. The patterning of the second masking layer may include multiple patterning lithography techniques (e.g., spacer-based double patterning). In one embodiment, a single masking layer including a silicon nitride layer is deposited over the second control gate layer and patterned as a silicon nitride hardmask. The isolation regions (or trenches) may be filled with an insulating material such as silicon dioxide or TEOS. In some cases, air gaps may also be formed within portions of the isolation regions.

Figure 7G:
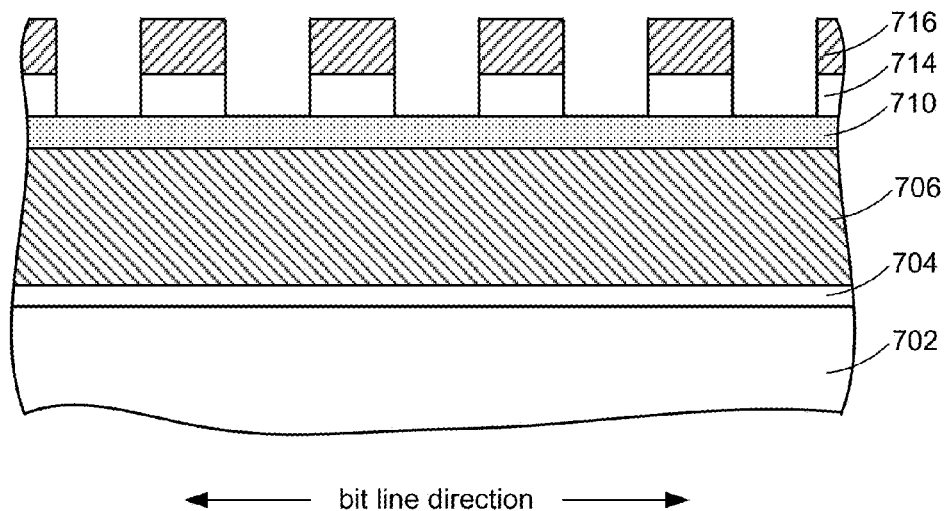
Figure 7H:
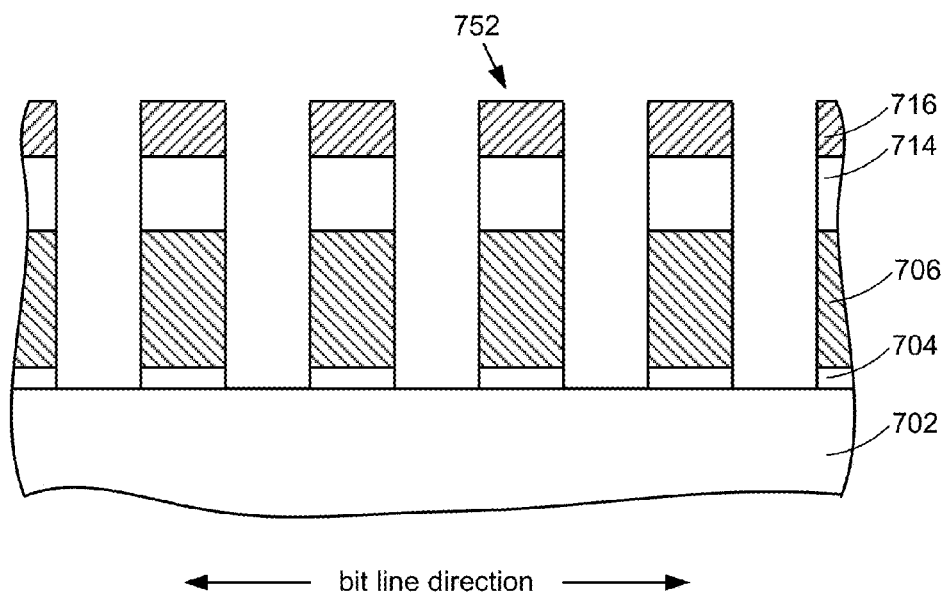

FIG. 7G depicts of a cross-sectional view in the bit line direction taken along line A-A of FIG. 7D after step 616 has been performed. FIG. 7H depicts of a cross-sectional view in the bit line direction taken along line B-B of FIG. 7D after step 616 has been performed. As depicted in FIG. 7H, floating gate transistor stack 752 has been fully formed, whereas the floating gate stacks of FIG. 7G have not formed due to the support strip 710 preventing the material below it from being etched. As depicted in FIG. 7G, the floating gate layer 706 below the support strip 710 effectively shorts out the memory cells associated with the NAND string. Thus, in this case, the penalty for providing structural support during the word line etch to form the floating gate stacks is a bit line in the memory array with reduced utility.

Referring to FIG. 6, in step 618, floating gate transistors and peripheral transistors are formed by forming source/drain junctions between the floating gate transistor stacks and/or the peripheral transistor stacks. In some cases, the first masking layer may be used during doping (e.g., via ion implantation) of the source/drain junctions associated with the floating gate transistors and/or the peripheral transistors. In one embodiment, the junctions associated with the floating gate transistors and the peripheral transistors are doped with an n-type dopant (e.g., phosphorus or arsenic).

Figure 7I:
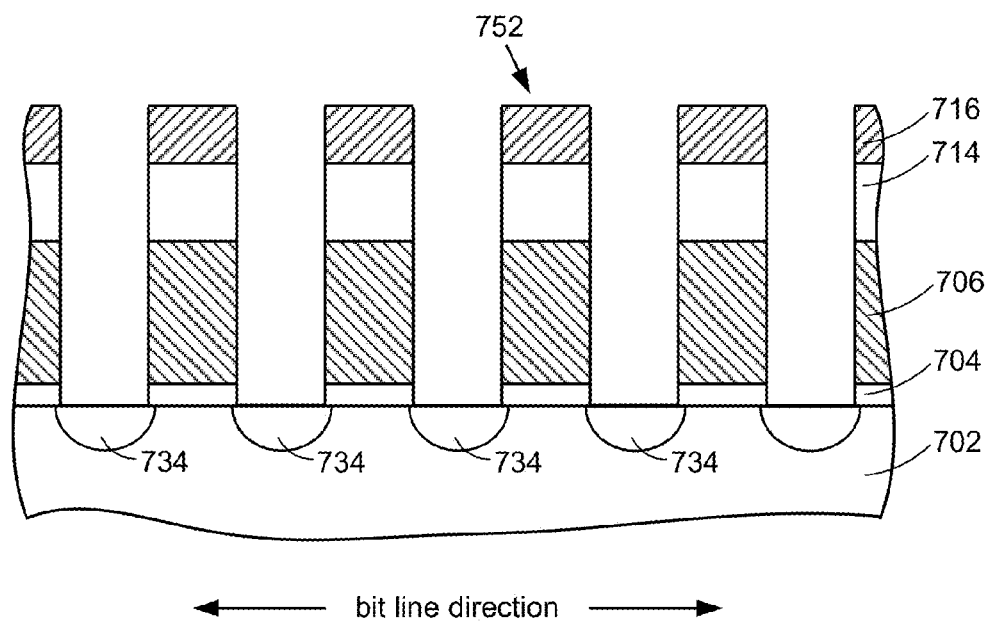

FIG. 7I depicts a cross-sectional view in the bit line direction taken along line B-B of FIG. 7D after step 618 has been performed. As depicted, diffusion regions 734 have been formed between the floating gate transistor stacks, thereby creating a portion of a NAND string.

Structural support may also be provided to high aspect ratio device structures by etching device structures that include inherent structural support. For example, rather than fabricating long and straight device structures (e.g., lines and memory stacks), the device structures may themselves include bends in order to provide lateral support.

Figure 8B:
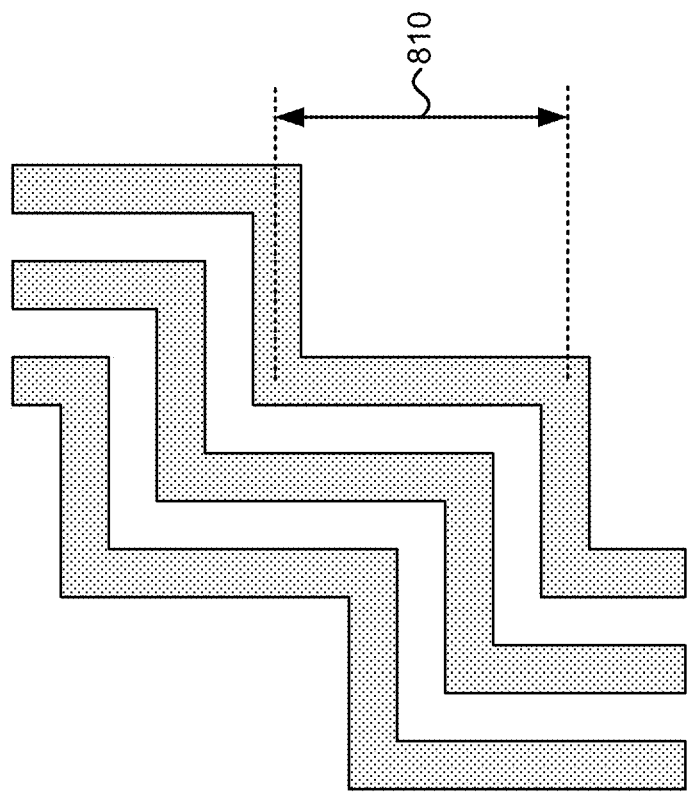
FIG. 8B depicts another embodiment of a portion of a word line mask.
Figure 8A:
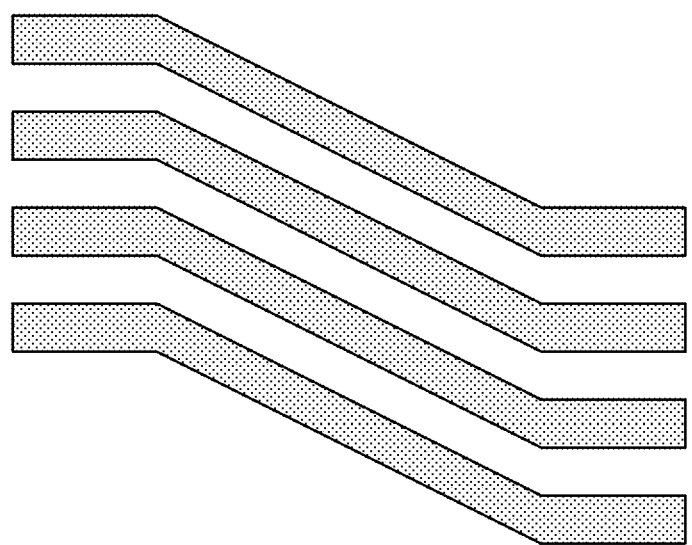
FIG. 8A depicts one embodiment of a portion of a word line mask.

FIG. 8A depicts one embodiment of a portion of a word line mask. As depicted, the word line mask includes four word lines that are bent in order to provide lateral support to the device structures below the word lines during the word line etch for forming NAND strings. FIG. 8B depicts another embodiment of a portion of a word line mask. As depicted, the word line mask includes three word lines that are bent in order to provide lateral support to the device structures below the word lines during the word line etch for forming NAND strings. The bends in each word line may be made at 90 degree angles (Manhattan routing) in order to relieve potential optical proximity correction (OPC) issues. In some cases, the spacing 810 between the bends (or rigid support portions) may be substantially constant for each of the word lines. One benefit of using a word line mask that provides inherent structural support is that the additional processing steps necessary to form a support strip (or other structure for providing structural support during a word line etch for forming NAND strings) need not be performed.

Figure 9:
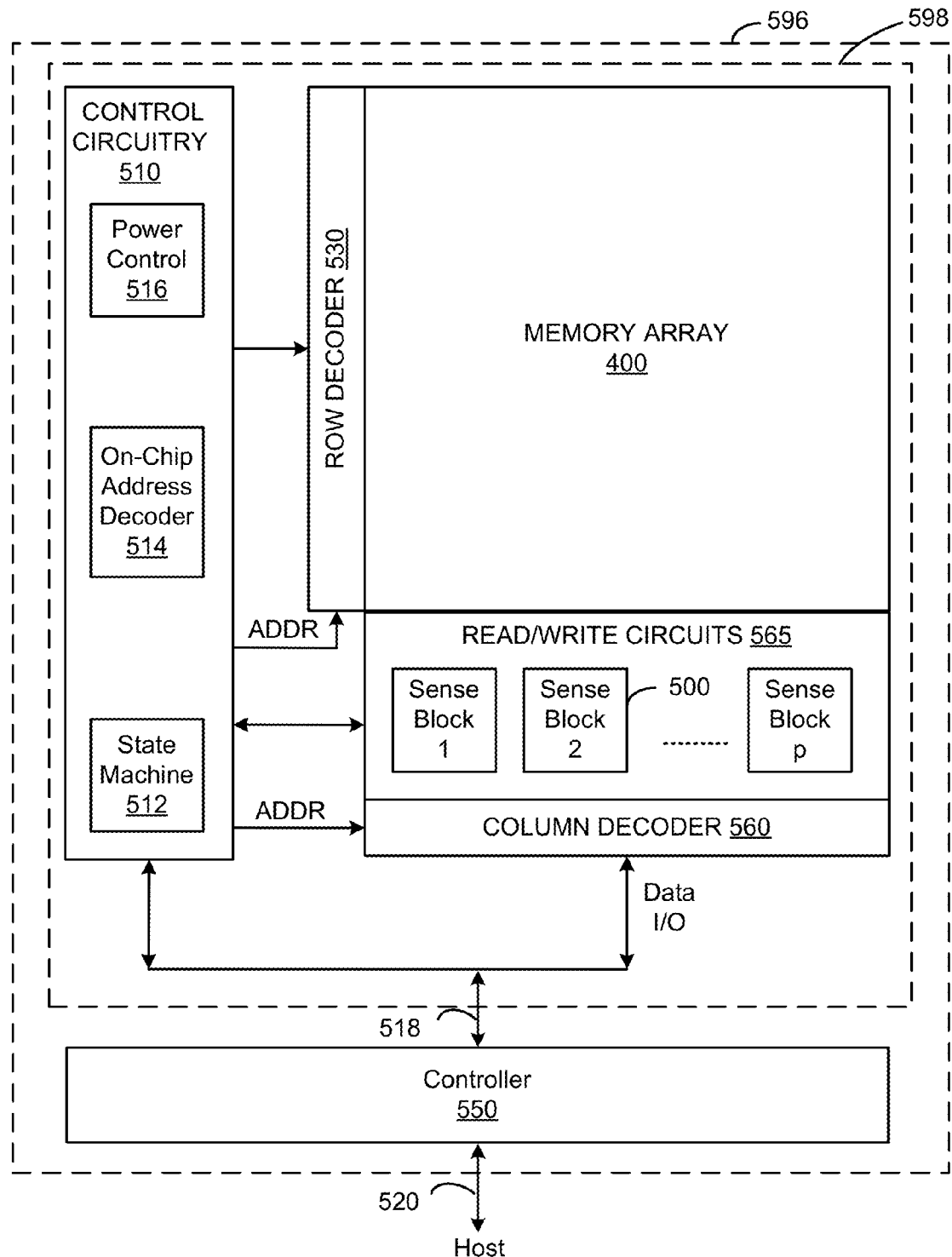
FIG. 9 depicts one embodiment of a non-volatile storage system.

The technology described herein may be used to manufacture portions of a non-volatile storage system. FIG. 9 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 400 (e.g., a NAND flash memory array), control circuitry 510, row decoder 530, column decoder 560, and read/write circuits 565. In one embodiment, access to the memory array 400 by the various peripheral circuits (e.g., row decoders or column decoders) is implemented in a symmetric fashion, on opposite sides of the array, so that the densities of access lines and circuitry on each side are reduced by half. The memory array 400 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 400. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that can create voltages larger than the supply voltage.

In some embodiments, one or more of the components (alone or in combination), other than memory array 400, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 400 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 10:
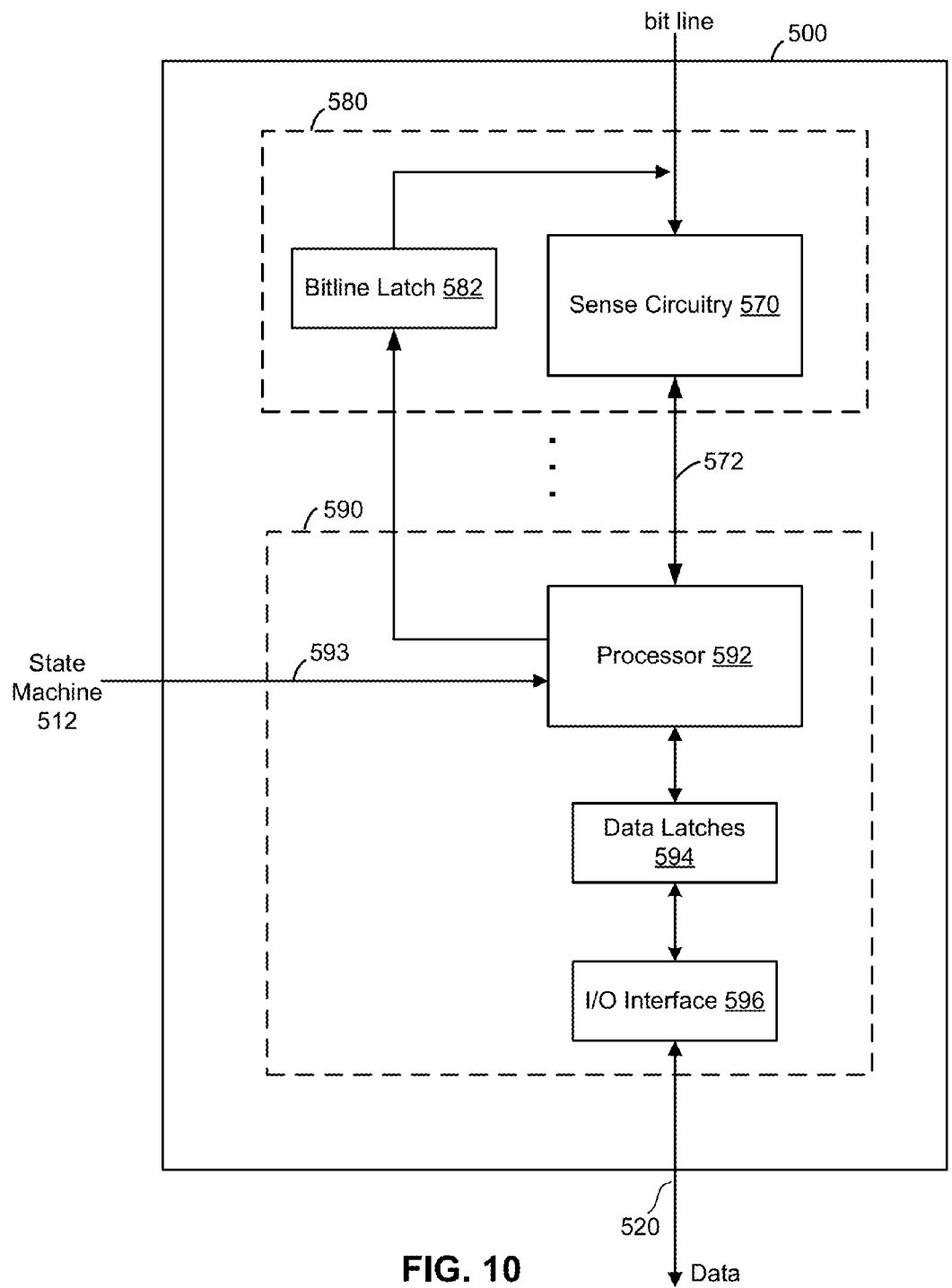
FIG. 10 depicts one embodiment of a sense block.

FIG. 10 depicts one embodiment of a sense block 500, such as sense block 500 in FIG. 9. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 400 in FIG. 9. I/O interface 596 provides an interface between data latches 594 and the data bus 520.

During a read operation or other storage element sensing operation, a state machine, such as state machine 512 of FIG. 9, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

One embodiment of the disclosed technology includes forming a first layer of material over a substrate, etching one or more isolation regions through the first layer of material to form one or more column strips, forming a first support strip over a first column strip of the one or more column strips, forming a second layer of material over the one or more column strips and the first support strip, and etching one or more trenches extending through the second layer of material and a subset of the one or more column strips. The first support strip prevents the first column strip from being etched during the etching one or more trenches.

One embodiment of the disclosed technology includes forming a first layer of charge storage material over a substrate, etching the first layer of charge storage material to form one or more column strips arranged in a first direction, and forming one or more support strips arranged in the first direction. A first support strip of the one or more support strips is formed over a first column strip of the one or more column strips. The method further includes forming a dielectric layer over the one or more column strips and the one or more support strips, forming a first control gate layer over the dielectric layer, and forming one or more floating gate transistor stacks. The forming one or more floating gate transistor stacks includes etching through the first control gate layer and a subset of the one or more column strips. The first support strip prevents the first column strip from being etched during the etching through the first control gate layer and a subset of the one or more column strips.

One embodiment of the disclosed technology includes a microelectronic device including one or more column strips arranged in a first direction, a first support strip arranged in the first direction, a second layer of material disposed over the one or more column strips and the first support strip, and one or more trenches. The first support strip is disposed over a first column strip of the one or more column strips. The one or more trenches extend through the second layer of material and a subset of the one or more column strips. The first support strip prevents the first column strip from being etched during formation of the one or more trenches.

Various features and techniques have been presented with respect to the NAND flash memory architecture. It will be appreciated from the provided disclosure that implementations of the disclosed technology are not so limited. By way of non-limiting example, embodiments in accordance with the present disclosure may be used in the fabrication of a wide range of semiconductor devices, including but not limited to logic arrays, volatile memory arrays including SRAM and DRAM, and non-volatile memory arrays including NOR flash memory and NAND flash memory.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" are used to described different embodiments and do not necessarily refer to the same embodiment.

For purposes of this document, a connection can be a direct connection or an indirect connection (e.g., via another part). The use of the terms coupled and connected may refer to a direct connection or an indirect connection.

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for manufacturing microelectronic devices, comprising:
   forming a first layer of material over a substrate;
   etching one or more isolation regions through the first layer of material to form one or more column strips;
   forming a first support strip over a first column strip of the one or more column strips;
   forming a second layer of material over the one or more column strips and the first support strip; and
   etching one or more trenches extending through the second layer of material and a subset of the one or more column strips, the first support strip prevents the first column strip from being etched during the etching one or more trenches.

2. The method of claim 1, further comprising:
   forming a dielectric layer over the one or more column strips and the first support strip, the second layer of material is formed over the dielectric layer.

3. The method of claim 2, wherein:
   the first layer of material comprises a floating gate layer; and
   the second layer of material comprises a control gate layer.

4. The method of claim 3, wherein:
   the etching one or more trenches forms one or more floating gate transistor stacks.

5. The method of claim 3, wherein:
   the etching one or more trenches includes performing a word line etch extending through the control gate layer, the dielectric layer, and the floating gate layer.

6. The method of claim 1, wherein:
   the first column strip is arranged in a first direction; and
   the first support strip is arranged in the first direction.

7. The method of claim 6, wherein:
   the first direction corresponds with a bit line direction.

8. The method of claim 6, wherein:
   the one or more trenches are arranged in a second direction orthogonal to the first direction.

9. The method of claim 1, wherein:
   the first support strip includes silicon nitride.

10. The method of claim 1, wherein:
    the first column strip is associated with a first width; and
    a second column strip of the one or more column strips is associated with a second width, the first width is wider than the second width.

11. A method for manufacturing microelectronic devices, comprising:
  forming a first layer of charge storage material over a substrate;
  etching the first layer of charge storage material to form one or more column strips arranged in a first direction;
  forming one or more support strips arranged in the first direction, a first support strip of the one or more support strips is formed over a first column strip of the one or more column strips;
  forming a dielectric layer over the one or more column strips and the one or more support strips;
  forming a first control gate layer over the dielectric layer; and
  forming one or more floating gate transistor stacks, the forming one or more floating gate transistor stacks includes etching through the first control gate layer and a subset of the one or more column strips, the first support strip prevents the first column strip from being etched during the etching through the first control gate layer and a subset of the one or more column strips.

12. The method of claim 11, wherein:
the etching through the first control gate layer and a subset of the one or more column strips includes etching one or more trenches arranged in a second direction orthogonal to the first direction.

13. The method of claim 11, wherein:
the etching through the first control gate layer and a subset of the one or more column strips comprises a word line etch extending through the first control gate layer, the dielectric layer, and the first layer of charge storage material.

14. The method of claim 11, wherein:
the first direction corresponds with a bit line direction.

15. The method of claim 11, wherein:
the first support strip includes silicon nitride.

16. The method of claim 11, wherein:
the first column strip is associated with a first width; and
a second column strip of the one or more column strips is associated with a second width, the first width is wider than the second width.

17. The method of claim 1, wherein:
the one or more column strips are arranged in a first direction, the first support strip is arranged in the first direction, the one or more trenches are arranged in a second direction orthogonal to the first direction, the one or more column strips include the first column strip and a second column strip, the etching one or more trenches includes etching through at least a portion of the second column strip.

18. The method of claim 11, wherein:
the one or more column strips include the first column strip and a second column strip, the etching through the first control gate layer and a subset of the one or more column strips includes etching one or more trenches arranged in a second direction orthogonal to the first direction, the etching one or more trenches includes etching through at least a portion of the second column strip.

* * * * *